United States Patent
Laturell et al.

(10) Patent No.: US 10,090,771 B2
(45) Date of Patent: Oct. 2, 2018

(54) SWITCHING MODE POWER AMPLIFIER WITH LOAD ISOLATION

(71) Applicant: Sparton Corporation, Schaumburg, IL (US)

(72) Inventors: Don Laturell, Oak Hill, FL (US); James Pleterski, New Smyrna, FL (US)

(73) Assignee: Sparton Corporation, Schaumburg, IL (US)

( * ) Notice: Subject to any disclaimer, the term of this patent is extended or adjusted under 35 U.S.C. 154(b) by 223 days.

(21) Appl. No.: 15/220,705

(22) Filed: Jul. 27, 2016

(65) Prior Publication Data

US 2017/0040902 A1  Feb. 9, 2017

Related U.S. Application Data

(60) Provisional application No. 62/201,347, filed on Aug. 5, 2015.

(51) Int. Cl.
| | |
|---|---|
| *H03F 3/217* | (2006.01) |
| *H02M 3/335* | (2006.01) |
| *H03F 1/02* | (2006.01) |
| *H03F 3/183* | (2006.01) |
| *H03F 3/30* | (2006.01) |

(Continued)

(52) U.S. Cl.
CPC ....... *H02M 3/33546* (2013.01); *G10K 11/006* (2013.01); *H03F 1/0222* (2013.01); *H03F 3/183* (2013.01); *H03F 3/2171* (2013.01); *H03F 3/2173* (2013.01); *H03F 3/3064* (2013.01); *H03K 5/1536* (2013.01); *H03F 2200/345* (2013.01); *H03F 2200/351* (2013.01);

(Continued)

(58) Field of Classification Search
CPC ............. H02M 3/33546; G10K 11/006; H03F 1/0222; H03F 3/2173; H03F 3/3064; H03F 2200/345; H03F 2200/341; H03F 2200/534; H03F 2200/537; H03F 2200/541; H01F 3/183; H03K 5/1538
USPC ......................................................... 307/151
See application file for complete search history.

(56) References Cited

U.S. PATENT DOCUMENTS

| 3,899,745 A | * | 8/1975 | Fletcher | .................. H03F 3/217 330/251 |
| 5,949,633 A | * | 9/1999 | Conway | .................. H02H 7/04 361/36 |
| 6,496,059 B1 | | 12/2002 | Nguyen | |

FOREIGN PATENT DOCUMENTS

| EP | 0951141 A2 | 10/1999 |
| JP | H0946144 A | 2/1997 |

* cited by examiner

*Primary Examiner* — Dinh T Le
(74) *Attorney, Agent, or Firm* — Quinn IP Law (57) ABSTRACT

A power amplifier device includes first and second pairs of semiconductor switches, transformers, and a zero-crossing detection circuit for detecting a zero voltage crossing of an analog input signal. The switches of the first pair receive a respective positive and negative component of the input signal. The transformers store energy from the positive and negative components, respectively. Each transformer releases accumulated energy when the respective switch of the first pair turns off The switches of the second pair have opposite switching states and are connected between a respective transformer and a load, e.g., a transducer, speak, or motor. Each switch receives released energy from the respective transformer. A switching state of each switch of the second pair changes in response to a detected zero voltage crossing of the input signal to transfer the released (Continued)

energy to the load. A system includes the device and the load.

16 Claims, 4 Drawing Sheets

(51) Int. Cl.
    *G10K 11/00*     (2006.01)
    *H03K 5/1536*     (2006.01)

(52) U.S. Cl.
    CPC .. *H03F 2200/534* (2013.01); *H03F 2200/537* (2013.01); *H03F 2200/541* (2013.01)

SWITCHING MODE POWER AMPLIFIER WITH LOAD ISOLATION

CROSS-REFERENCE TO RELATED APPLICATIONS

This application claims the benefit of U.S. Provisional Patent Application No. 62/201,347 filed on Aug. 5, 2015, which is hereby incorporated by reference in its entirety.

TECHNICAL FIELD

The present disclosure relates to a switching mode power amplifier having a switching function that is isolated from a load.

BACKGROUND

Power amplifiers are electronic devices operable for amplifying an input to a level that is suitable for driving a load, such as an audio speaker, a transducer, or an electric motor. For alternating current (AC) input signals, the impedance of the load is determined by the frequency of the input signal as well as the resistance, capacitance, and inductance of the load. Power amplifiers typically include a power supply, an input stage, and an output stage. The power supply may be of the linear type or the switching mode type, with the latter type providing higher relative energy efficiencies. There is a particular type of power amplifier known as a switchmode power amplifier. This type of power amplifier may also contain a power supply of the linear type or of the switching mode type.

A switch mode power supply may also be used to modulate a signal in a particular type of switchmode power amplifier. The output stage, controlled by the input stage, applies precisely timed pulses to a load to amplify the relatively weak input signal and thereby generate an output signal having a power level sufficient for driving the load. Such power amplification may be provided via a transformer. Conventionally, the power supply remains connected to the load, with the impedance of the load tending to lower the overall efficiency of the amplifier.

Of the power amplifier types noted above, switching mode-type power amplifiers in particular operate by applying electrical power to the load. For instance, fixed or variable width pulses representing a desired signal may be provided by a fixed-amplitude power supply at precise intervals. Alternatively, fixed or variable width pulses may be provided from a variable power supply. The frequency of the switching pulses is significantly higher than that of the desired output signal so that energy from the switching pulses can be integrated over time to reproduce the desired signal. A high switching frequency is also desirable in order to simplify the task of filtering out undesired energy produced at the switching frequency. Depending on the impedance of the load, higher power required at the load may require a higher voltage. Thus, the power supply used for high-impedance loads must produce higher voltage levels relative to voltage levels used with low impedance loads.

The switching speed of a typical solid-state semiconductor switch operating at higher voltage levels is relatively slow compared to the speed of a switch used in lower voltage devices. The parasitic series loss of a high-voltage semiconductor switch is also higher than a lower voltage device. As a result, it may be difficult to precisely time the delivery of signal pulses to a given load. Precisely timed delivery of signal pulses is important to maintaining high signal fidelity. If the load is connected during the switching interval, the finite switching time and parasitic switching loss of the semiconductor switch will result in increased distortion observable at the load.

A switching mode amplifier may employ a boost transformer. If the boost transformer also carries the desired signal in addition to the switching signal, the boost transformer design is limited by the relationship to the frequency of the carrier signal, i.e., the carrier frequency. Prior art designs without load isolation require a close relationship between the signal frequency and the magnetic design. For instance, if the demodulated signal frequency falls within an example frequency range used for driving audio applications, the magnetizing inductance must be high with respect to the demodulated frequency involved and therefore the transformer must use a magnetic core having a high magnetic permeability in order to be sufficiently compact for practical use. Furthermore, the saturation profile of any magnetic material used in the construction of the transformer is directly related to the demodulated frequency or carrier frequency. This relationship to the demodulated or carrier signal significantly limits the types of magnetic material that can be used, and also limits the choice of upper switching frequency. This limit on upper switching frequency is due to accumulation of eddy current losses and other factors.

Modulation techniques such as pulse width modulation (PWM) or delta-sigma modulation (DSM) may be used for the carrier function in an amplifier. Delta-sigma modulators, which convert a high-resolution input signal into a high-frequency signal having a relatively low resolution, e.g., a 1-bit pulse train, are particularly useful when the ratio of modulation to the carrier signal is relatively low, for instance a ratio of less than 10. DSM can be used to shape quantization noise and thereby reduce noise within the frequency range of the input signal. PWM can be used when the ratio of modulation to the carrier is relatively large, e.g., greater than 10. PWM may be easier to implement for the case of higher ratio of modulation-to-signal, but requires a faster switching speed than DSM. The present state of the art attempts to minimize the effects of finite transition time of the transistors used in the design of power amplifiers of the types using high-speed switching.

SUMMARY

An improved switching mode power amplifier device is disclosed herein that provides load isolation. In the disclosed configurations the impedance of the load does not lower the efficiency or accuracy of the amplifier device in the conventional manner, i.e., since the load is isolated during the switching interval. Additionally, the amplifier device is scalable to different loads over a very wide carrier frequency range in different applications, limited only by switching speeds and parasitic terms of semiconductor devices and magnetic devices used in the construction of the amplifier device. That is, a power supply conventionally remains connected to the load, with the impedance of the load tending to lower the overall efficiency or accuracy of the switching power amplifier device. Therefore, as will be appreciated by those of ordinary skill in the art in view of the present disclosure, high efficiency combined with high signal accuracy are among the important advantages of load isolation.

In particular, the power amplifier device disclosed herein addresses some of the above-noted design limitations of the prior art by eliminating undesirable effects of finite transition time, and by providing higher efficiencies and other possible performance advantages relative to conventional switching mode power amplifiers. The power amplifier disclosed herein also provides load isolation in two manners: by isolating the load via switching of solid-state semiconductor switches only at detected zero-crossings of an input signal, and by isolating the same load from a power supply via the use of transformers, e.g., coupled inductors or forward converters, having a high degree of coupling resulting in low leakage inductance and thus higher efficiency.

As part of a disclosed embodiment, positive and negative components of a modulated signal are processed separately through different transformers and solid-state semiconductor switches. Energy transfer to and from primary windings of the transformers is controlled via another set of solid-state semiconductor switches and diodes as set forth herein. A goal of the present disclosure is to produce high efficiency signal amplification with low levels of signal distortion. The impedance load, the identity of which may vary with the intended application, may be variously embodied by way of non-limiting examples as audio speakers, transducers, electric motors, and/or any other suitable load requiring an amplified input signal for operation.

In an example embodiment, a power amplifier device for delivering power to a load includes first and second pairs of switches, a pair of transformers, and a zero-crossing circuit. The respective switches of the first pair of switches receive a respective positive and a negative component of a modulated input signal formed from an analog input signal and a carrier signal. A switching rate of the switches in the first pair exceeds a frequency of the carrier signal. The transformers, each of which is electrically connected to a respective switch of the first set of switches, are operable for accumulating energy from the positive and negative components, respectively.

In a possible non-limiting embodiment, each transformer is operable for releasing its accumulated energy only when the respective switch of the first pair of semiconductor switches is turned off.

The switches of the second pair of switches have opposite switching states. Each switch is electrically connected between a respective one of the transformers and the load, and each is operable for receiving the released energy from the respective transformers. A switching state of the switches in the second pair of switches changes only in response to a detected zero voltage crossing of the input signal. A closed/conducting switching state of the second pair of switches transfers the released energy to the load in this particular embodiment, with the zero-crossing detection circuit operable for detecting the zero voltage crossing.

The first pair of switches may be optionally embodied as metal-oxide semiconductor field effect transistors (MOSFETs) and the second pair of switches as insulated gate bipolar transistors (IGBTs), without limiting the switches to such embodiments.

Additionally, a method for delivering power to a load includes receiving a modulated input signal having separate positive and negative voltage components, with the modulated input signal being comprised of a carrier signal having a carrier frequency and an analog input signal having an input frequency. The method includes directing the positive and negative voltage components to first and second semiconductor switches, respectively, and then switching the first and second semiconductor switches at a rate equal to or exceeding the carrier frequency to thereby deliver energy from respective first and second transformers to respective third and fourth semiconductor switches.

The method also includes detecting a zero-crossing of the input signal using a zero-crossing detector chip or other circuit having a comparator circuit, and then selectively opening one of the third and fourth semiconductor switches and closing the other so as to deliver the released energy to the load only when the zero-crossing is detected.

A system is also disclosed herein having a modulation circuit operable for receiving and modulating an analog input signal, a load, and a power amplifier device. The modulation circuit is operable for generating a modulated input signal from a carrier signal and an analog input signal using a ternary modulation technique such as pulse width modulation or pulse density modulation.

The above and other features and advantages of the present disclosure will be readily apparent from the following detailed description of the embodiment(s) and best mode(s) for carrying out the described invention when taken in connection with the accompanying drawings and appended claims.

DETAILED DESCRIPTION

Figure 1:
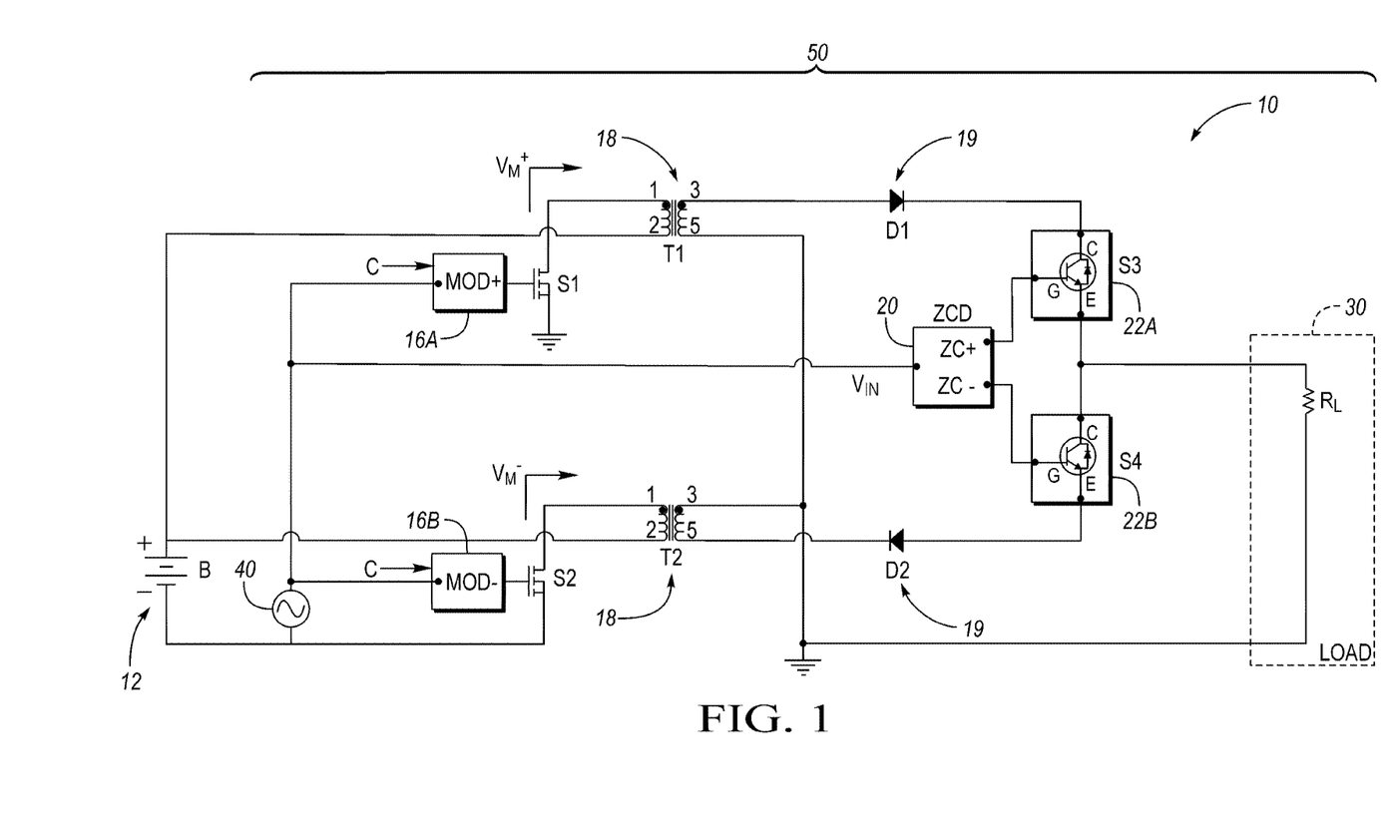
FIG. 1 is a schematic circuit diagram of an example embodiment of a switching mode power amplifier as described herein.

Referring to the drawings, wherein like reference numbers refer to like components, a system 50 is depicted that includes a switching mode power amplifier device 10 and an example load 30 represented schematically as a resistor $R_L$. The power amplifier device 10 is operable for amplifying a received modulated signal, and for ultimately powering the load 30 within the system 50 using energy released from the amplified modulated signal. The system 50 also includes a modulation circuit 16A, 16B operable for receiving an input signal 40, e.g., information encoded as a periodic or other time-varying signal, modulating the received input signal 40 using a carrier signal (arrow C), and outputting separate first and second modulated voltage signals ($V_M^+$, $V_M^-$) as respective positive and negative voltage components. While shown as separate elements 16A (MOD+) and 16B (MOD−) to indicate separate processing of positive and negative cycles of a waveform defining the input signal 40, the modulation circuit 16A, 16B may be embodied as a single integrated circuit outputting the separate first and second modulated voltage signals ($V_M^+$, $V_M^-$) via different pins (not shown), as will be appreciated by one of ordinary skill in the art.

Figure 1A:
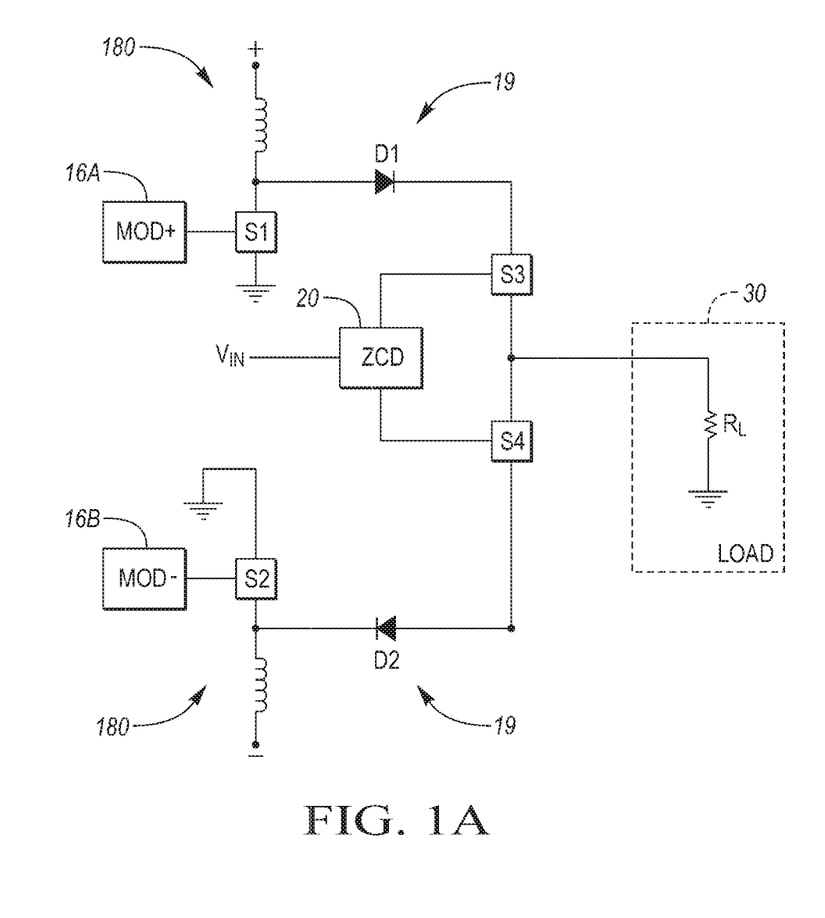
FIG. 1A is a schematic circuit diagram of an alternative embodiment of the switching mode power amplifier shown in FIG. 1.

Within the system 50 of FIG. 1, the power amplifier device 10 includes first and second pairs of solid-state/ semiconductor switches, i.e., a first switching pair formed respectively of a first and second semiconductor switch S1 and S2, and a second switching pair formed respectively of a third and fourth solid-state semiconductor switches S3 and S4, as well as a pair of transformers 18 formed from a first and second transformer T1 and T2 and a pair of steering diodes 19 formed from a respective first and second steering diode D1 and D2, all of which are described in further detail below. FIG. 1A depicts alternative transformers 180 in an uncoupled inductor alternative embodiment, with the battery 12 and input signal 40 omitted from FIG. 1A for simplicity. Additionally, all switches S1, S2, S3, and S4 of FIG. 1A are depicted schematically as boxes to indicate that any combination of suitable semiconductor switches may be used, such as the IGBTs and MOSFETs of FIG. 1 or other configurations as set forth herein. A zero-crossing detection (ZCD) circuit 20 in the form of an integrated circuit or other suitable structure is also used as part of the power amplifier device 10, receiving the input signal 40 as an input voltage VIN and providing separate outputs ZC+ and ZC− to respective solid-state switches S3 and S4 of the type described below. In some designs, the modulation circuit 16A, 16B may be positioned separately from the power amplifier device 10 without departing from the intended inventive scope.

With respect to the structure and intended function of each component of the power amplifier device 10 or the larger system 50 within which the power amplifier device 10 is used, a direct current (DC) battery (B) 12 may be embodied as a multi-cell battery of the type known in the art. The battery 12 has a calibrated DC voltage output level, e.g., approximately 120-150 VDC in an application-specific example embodiment in which the load 30 is a high-voltage transducer, e.g., for a sonobuoy or other device. As noted above, the modulation circuit 16A, 16B may be embodied as a single integrated chip or other circuit device although shown as separate elements for illustrative clarity.

The modulation circuit 16A, 16B is operable for modulating the received input signal 40 using the carrier signal (arrow C), e.g., via application of a periodic triangle wave, a square pulse wave, or other typical periodic or repeating modulation waveform. The terms "modulation" and "modulating" as used herein refer to any suitable ternary modulation technique, such as but not limited to pulse width modulation (PWM) or pulse density modulation (PDM). The term "ternary" as used herein means that the modulated signal has only three possible states, i.e., positive, zero, and negative voltage states. The modulation circuit 16A, 16B of FIG. 1 outputs the separate first and second modulated voltage signals ($V_M^-$, $V_M^+$), with a zero voltage crossing between the first and second modulated voltage signals ($V_M^+$, $V_M^-$) being automatically detected via operation of the zero-crossing detection circuit 20 and used in timing of the power switching control of the second pair of semiconductor switches S3 and S4 as explained below.

Figure 2:
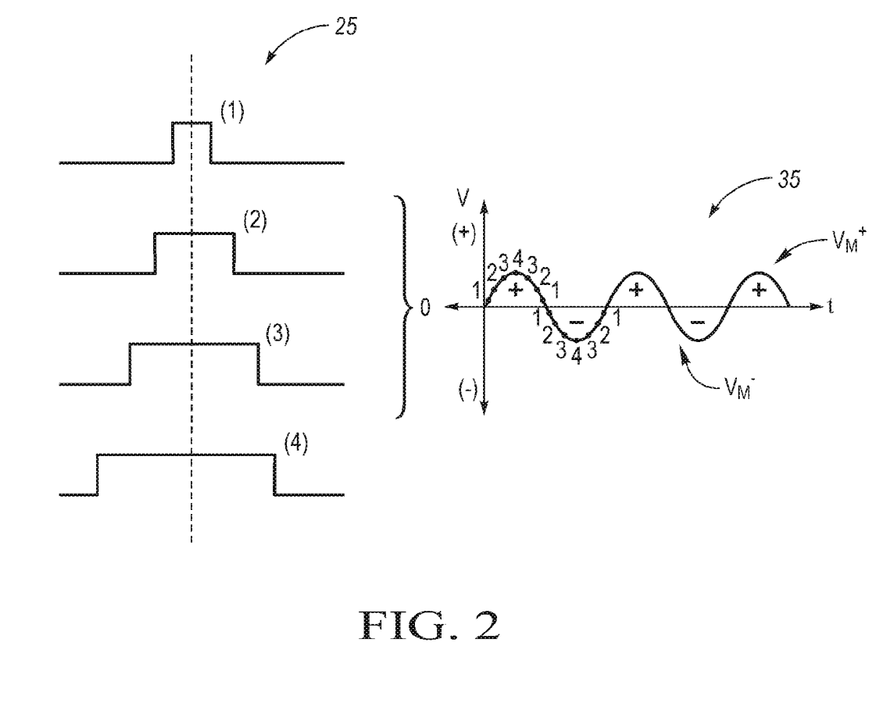
FIG. 2 depicts an example modulation pulse train and resultant integrated signal having positive and negative components.

Referring briefly to FIG. 2, ternary modulation used herein can be described via the example use of center-sampled modulation pulses 25 shown as progressively wider modulation pulses numbered 1, 2, 3, and 4. A waveform 35 demarcated by the same pulse numbers 1, 2, 3, and 4 depicts an integrated voltage (V) delivered over time (t) by the successive modulation pulses 25, and also depicts the ternary aspect of modulation noted above, i.e., with separate positive (+), negative (−), and zero (0) voltage levels. The modulation circuit 16A, 16B of FIG. 1 separates the positive (+) and negative (−) components, which respectively correspond to the first and second modulated voltage signals ($V_M^+$, $V_M^-$) described above. The modulated voltage signal ($V_M^+$) is then delivered to the primary windings of the first transformer T1 of FIG. 1 while the first semiconductor switch S1 is on/conducting. Similarly, the modulated voltage signal ($V_M^-$) is delivered to the primary windings of the second transformer T2 of FIG. 1 when the second semiconductor switch S2 is on/conducting.

The term "transformer" as used herein with reference to the example first and second transformers T1 and T2 refers to a set of primary and secondary inductor windings, whether configured as an optional coupled inductor as shown in FIG. 1 or as an uncoupled inductor as shown in FIG. 1A. As is known in the art, coupled inductors such asflyback converters store electrical energy from a power source in a primary winding whenever a semiconductor switch supplying power to the coupled inductor is turned on/conducting, but do not transfer stored energy to a secondary winding until the same switch is turned off. In a forward converter as typically used in a distributed power architecture, energy is transferred from the primary to the secondary winding while the switch supplying the primary winding is on/conducting. Of the various types of transformers in use, coupled inductors are specifically designed and intended to store energy, and therefore may provide certain performance advantages when used within the system 50 depicted in FIG. 1. However, coupled inductors are just one possible way to implement the disclosure.

In one of the possible embodiments, energy can be stored via the transformers T1 and T2 only when electrical current flows in the primary windings of the transformers T1 and T2. With power defined as energy delivered per unit time, power delivered to the load 30 is thus dependent on the rapid transfer of energy through the power amplifier device 10. In other words, if electrical current can be pushed more quickly through the primary windings of the transformers T1 and T2 of FIG. 1, more energy is ultimately produced as a function of energy (E), inductance (L), and electrical current (i), with this function represented mathematically as $E=\frac{1}{2}Li^2$.

As will be appreciated by those of ordinary skill in the art, the equation noted above is a solution to an integral, and thus establishes that an inductor acts an integrator of current. The integration time is much longer than the transition time of a semiconductor switch. That is, voltage across an inductor is expressed as $$V = L\frac{di}{dt}.$$

The increase of energy over time is expressed as. Thus, the energy stored in an inductor is expressed as $$E = \int dE = L\int_0^i idi = \frac{1}{2}Li^2,$$

with the time associated with overall switching function being a function of inductor switching. This in turn illustrates the linearity benefit of the present approach, as the ratio of the semiconductor transition time to the inductor current integration. time is a very small number, and therefore contributes very little to distortion. In addition, at low power, in a PWM system small pulse widths are needed, with wider pulse widths needed at high power. This means that static losses accumulate only as a function of power storage. The fact the load is isolated during this interval means that the only load during the charge interval is the inductor current.

The power amplifier device 10 of FIG. 1 is thus scalable to larger or smaller loads 30, with isolation of the load 30 provided in two different manners: via switching isolation due to the control of the second set of switches S3 and S4 only at the zero-crossing of the input signal 40, and via low levels of leakage inductance provided by the transformers T1 and T2.

Referring again to FIG. 1, the switches S1 and S2 respectively receive the corresponding voltage signals $V_M^+$ and $V_M^-$, and then transfer the voltage signals $V_M^+$ and $V_M^-$ to the respective first and second transformers T1 and T2. The semiconductor switches S3 and S4 are electrically connected to an output side of the first and second transformers T1 and T2, respectively, and thus are powered by the transformers T1 and T2 according to a particular switching control sequence as set forth below with reference to FIG. 4. The diode D1 in this embodiment is serially connected, i.e., connected in electrical series, between the first transformer T1 and the third semiconductor switch S3, while the diode D2 is serially connected between transformer T2 and the fourth semiconductor switch S4.

In the example embodiment as shown in FIG. 1, the first pair of semiconductor switches S1, S2 may be optionally embodied in a non-limiting application as metal-oxide semiconductor field effect transistors (MOSFETs) of the type known in the art, with the second pair of semiconductor switches S3, S4 may be optionally embodied as insulated gate bipolar transistors (IGBTs). As is known in the art, IGBTs have designated gate (G), emitter (E), and collector (C), each of which is labeled as such in FIG. 1. However, other solid-state switch configurations may be used depending on the intended application, including using only MOSFETs, only IGBTs, or using other gate-controlled solid-state switches. For instance, high electron mobility transistors (HEMTs) using gallium nitride (GaN) or other suitable materials may be used in lieu of MOSFETS and IGBTs. In general, the switching rate and thus the design of the first pair of semiconductor switches S1, S2 depends on the modulation encoding scheme used by the modulation circuit 16A, 16B.

As a design consideration, within the scope of the present disclosure the first pair of semiconductor switches S1, S2 has a high switching speed requirement in that the first pair of semiconductor switches S1, S2 must always switch at the or above the frequency of the carrier (C), i.e., the carrier frequency. By contrast, the switches of the second pair of semiconductor switches S3, S4 change their respective switching states at a substantially slower rate than that of the first pair of semiconductor switches S1, S2, i.e., switching only at the zero-crossing rate of the input signal 40, with the carrier frequency expected herein to be substantially higher than the zero-crossing rate.

Figure 3:
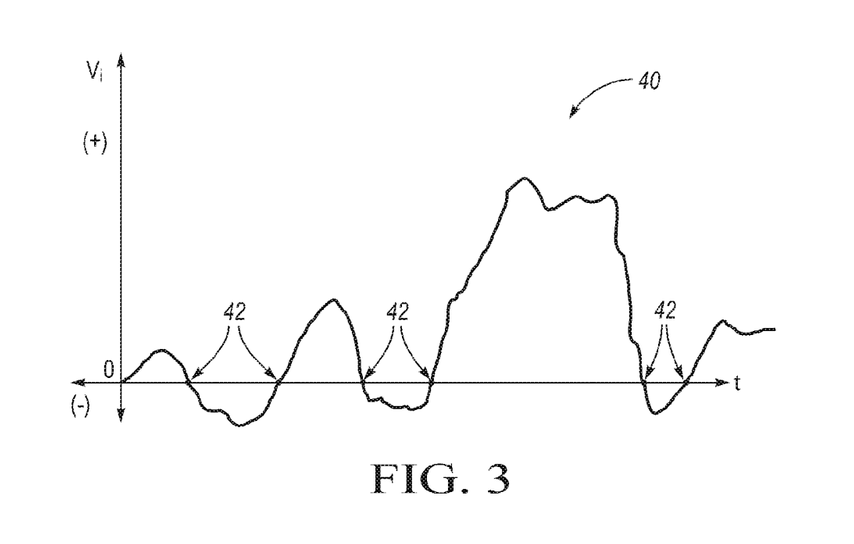
FIG. 3 is a time plot of an example input signal having zero voltage crossing points used to control switch timing of a portion of the circuit shown in FIG. 1.

To illustrate the latter point, FIG. 3 depicts the input signal 40 as a time-varying signal, i.e., having a voltage magnitude V, that changes over time (t). The input signal 40 has positive (+) and negative (−) components as shown. The input signal 40 crosses through zero volts whenever the input signal 40 changes its sign, with each zero-crossing demarcated in FIG. 3 by a corresponding zero-crossing point 42. The zero-crossing detection circuit 20 of FIG. 1, for instance an operational amplifier or other suitable comparator circuit or other integrated circuit, detects each zero-crossing point 42 and, in response to such detection, activates a designated one of the third or fourth semiconductor switches S3 or S4 and simultaneously deactivates the other semiconductor switch S3 or S4 in the same pair, with the identity of the activated switch changing with the detection of each successive zero-crossing point 42.

That is, when the third semiconductor switch S3 of FIG. 1 is actively conducting, the fourth semiconductor switch S4 is not conducting, and vice versa. In this manner, the switching function of the first pair of semiconductor switches S1, S2 is temporally separated from any downstream switching used to deliver stored energy from the transformers T1 or T2 to the load 30, i.e., the switching function in the switching mode power amplifier device 10 is isolated from its load function via targeted low-frequency/zero-crossing control of the second pair of semiconductor switches S3, S4 and diodes D1, D2.

As part of the power amplifier device 10, the steering diodes D1 and D2 direct the energy released by the transformers T1, T2 to the second pair of switches S3, S4. The diodes D1, D2 are thus an important part of the load isolation functionality enabled by the present disclosure, and for that reason should be constructed from materials of sufficiently high-speed and high-energy density, such as silicon carbide, gallium nitride, or other high-mobility semiconductor materials. With respect to the transformers T1 and T2 of FIG. 1, these devices may be embodied as suitable energy storage devices, such as those having a linear output as a function of pulse density or pulse width. In the embodiment of FIG. 1, energy is stored in the primary winding of each of the transformers T1 and T2 when the corresponding semiconductor switch S1 or S2 is on/conducting, and is transferred to the secondary winding only when the corresponding semiconductor switch S1 or S2 is turned off, i.e., is not conducting.

The transformers T1, T2 should be constructed in such a manner as to provide high-quality inductive coupling between the primary and secondary windings and thereby provide low levels of leakage inductance. As used herein, "low leakage inductance" refers to levels of less than about $\frac{1}{80}^{th}$ to $\frac{1}{100}^{th}$ of a primary inductance of the primary windings. In another optional embodiment, the primary and secondary windings of each of the transformers T1 and T2 may be concentrically wound, i.e., the primary winding of the first transformer T1 is wound concentrically with the secondary winding of the second transformer T1, with the same arrangement in the second transformer T2. Additionally, the transformers T1 and T2 are electrically connected in reverse polarity with respect to each other.

The identity of the load 30 shown schematically in FIG. 1 may vary with the particular application. In general, in order to benefit fully from the present disclosure, the load 30 may be a high impedance reactive load having a power factor exceeding 0.65 for high-power applications. Example embodiments of the load 30 may include a transducer, an antenna, an audio speaker, or an electric motor. In a particular embodiment, the load 30 may be a sonobuoy transducer used as part of a sonobuoy assembly, for instance to deploy or actuate directional hydrophones or other aquatic acoustic sensors and/or signal transmitters, without in any way limiting applications to such a field of art.

Figure 4:
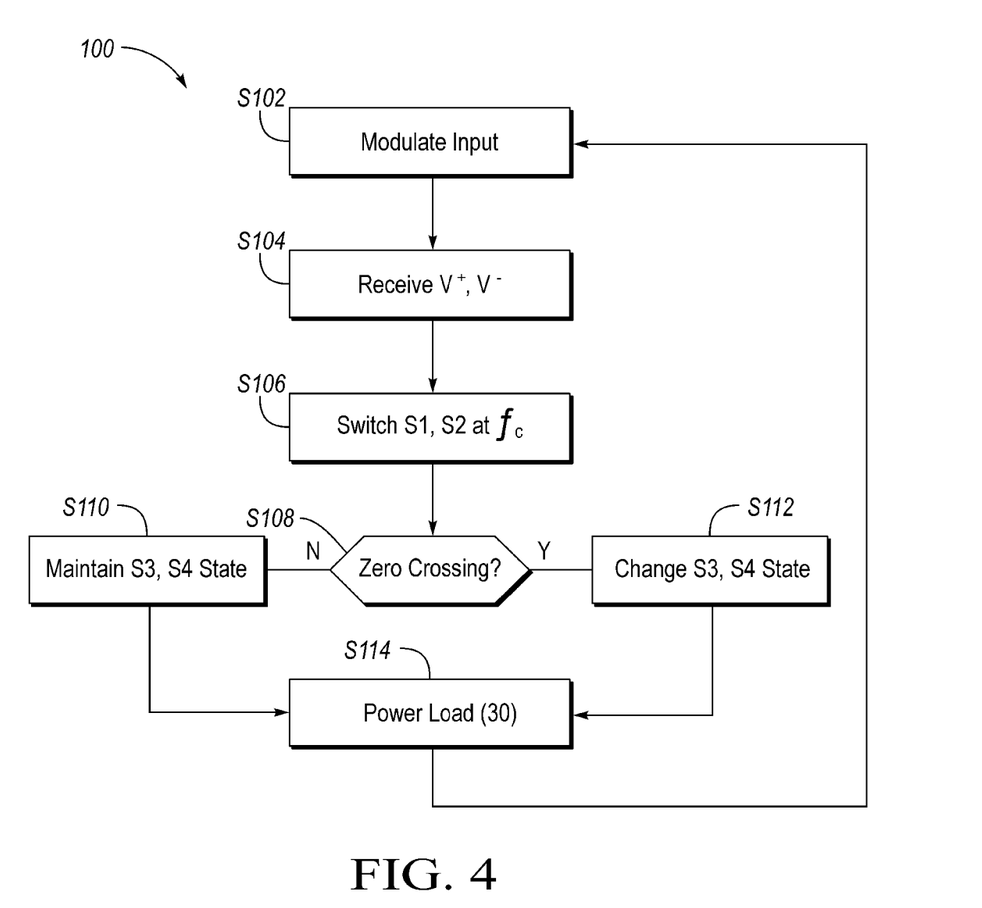
FIG. 4 is a schematic flow chart describing an example method for using the switching mode power amplifier shown in FIG. 1.

Referring to FIG. 4, an example embodiment of the method 100 begins with step S102, which may be executed offboard with respect to the remaining steps of the method 100. At step S102, the input signal 40 of FIG. 1 is modulated. The input signal 40 may be transmitted from a remote location such as a transmission tower or antenna and communicated to the modulation circuit 16A, 16B as is well known in the art. The modulation circuit 16A, 16B itself may be separate from the switching mode power amplifier device 10. Step S102 may entail modulating the input signal 40 via a carrier signal (arrow C) using ternary PWM, ternary PDM, or other conventional ternary modulation techniques, doing so via operation of the modulation circuit 16A, 16B of FIG. 1. The method 100 proceeds to step S104 once the input signal 40 has been modulated.

At step S104, the modulated signal that is output by the modulation circuit 16A, 16B is separated into its positive and negative voltage components ($V_M^+$, $V_M^-$) as shown in FIG. 2. In practice, the modulation circuit 16A, 16B may be designed to output separate positive and negative voltage components ($V_M^+$, $V_M^-$) as opposed to separating a modulated signal into the different components. The positive voltage component ($V_M^+$) is then electrically conducted or transmitted to the gate (G) of the first semiconductor switch S1 shown in FIG. 1. Likewise, the negative voltage component ($V_M^-$) is delivered to the gate (G) of the second semiconductor switch S2. The method 100 then proceeds to step S106.

Step S106 entails switching the first set of semiconductor switches S1, S2 at a rate that is equal to or greater than the carrier frequency ($f_C$). For example, if the carrier frequency is 30-40 kHz, the switching frequency of the first pair of semiconductor switches S1, S2 may be at least 30-40 kHz, or approximately 350-400 kHz or about 10 times the carrier frequency in other embodiments. Only when the first or second semiconductor switch S1 or S2 is commanded to an on/conducting state will energy be stored in the primary windings of the transformers T1 or T2, respectively. The method 100 then proceeds to step S108.

Step S108 entails detecting a zero voltage crossing of the input signal 40 via the zero-crossing detection circuit 20 of FIG. 1, with example zero-crossing points 42 depicted in FIG. 3. Step S108 may include using an operational amplifier or other suitable comparator circuit to detect the zero voltage crossing. The method 100 proceeds to step S110 when a zero voltage crossing is not detected, and to step S112 when a zero voltage crossing is detected.

At step S110, the present switching state of the second pair of semiconductor switches S3, S4 is maintained, i.e., not changed. For instance, if the third semiconductor switch S3 is on/conducting and the fourth semiconductor switch S4 is off/not conducting, then switch S3 remains on and switch S4 remains off. The method 100 proceeds to step S114.

Step S112 includes changing the switching state of the semiconductor switches S3, S4 from a state that existed just prior to the detection of a zero voltage crossing at step S110. For example, if the third semiconductor switch S3 was on/conducting and the fourth semiconductor switch S4 was off/not conducting, the detection of a zero voltage crossing at step S108 results in the third semiconductor switch S3 turning off and the fourth semiconductor switch S4 turning on, for instance via a change of voltage delivered to the gates (G) shown in FIG. 1. The method 100 then proceeds to step S114.

At step S114, electrical power or energy is delivered to the load 30 through the on/conducting semiconductor switch S3 or S4, whichever of the two is in a conducting state.

As set forth above, the power amplifier device 10 provides for signal conversion and amplification via the use of the transformers T1, T2 and targeted low-frequency switching control of the second pair of semiconductor switches S3, S4 downstream of the transformers T1, T2. This occurs only at detected zero voltage crossing points of an input signal, such as the zero voltage crossing points 42 and input signal 40 of FIG. 3, to allow the load 30 and its associated impedance to be isolated from the high-speed switching function of the first pair of semiconductor switches S1, S2. As a result, the first pair of semiconductor switches S1, S2 is able to work more efficiently than would ordinarily occur in existing designs, with gains of 30% in efficiency or more being possible relative to the typical efficiency levels available via the conventional art. Also, the power amplifier device 10 allows for a fully scalable power output, with the high-efficiency control technique of the method 100 minimizing internal dissipation of heat within the power amplifier device 10. Such benefits may be desirable in many applications, including but not limited to transducer systems of the type used for coupling acoustic pulse energy into water, e.g., sonobuoy applications, audio applications in which modulated waves are transmitted to an antenna for playback via a set of speakers, and the like.

The detailed description and drawings are supportive and descriptive of the disclosure, but the scope of the invention is defined solely by the claims. While some of the best modes and other embodiments for carrying out the disclosure have been described in detail, various alternative designs and embodiments exist for practicing the disclosure as defined in the appended claims.

What is claimed is:

1. A switching mode power amplifier device for delivering power to a load, the switching mode power amplifier device comprising:

a first pair of semiconductor switches comprising first and second semiconductor switches each configured to receive a modulated input signal from a modulating circuit, the modulated input signal being comprised of a time-varying analog input signal and a carrier signal having a carrier frequency, the modulated input signal having modulated positive and negative voltage signals respectively corresponding to positive and negative components of the time-varying analog input signal, the time-varying analog input signal changing between the positive and negative components at a zero-voltage crossing of the time-varying analog input signal, wherein a switching rate of the first and second semiconductor switches equals or exceeds the carrier frequency of the modulated input signal;

first and second transformers respectively connected to the first and second semiconductor switches, and respectively receiving the modulated positive and negative voltage signals from the first and second semiconductor switches, the first and second transformers being configured to store energy from the modulated input signal;

a second pair of semiconductor switches comprising third and fourth semiconductor switches that are electrically connected between a respective one of the first and second transformers and the load, wherein a switching state of the third and fourth semiconductor switches changes in response to an output signal indicative of the zero-voltage crossing of the time-varying analog input signal, and wherein a closed/conducting switching state of the third and fourth semiconductor switches transfers the energy stored in the first and second transformers to the load, such that the load is isolated from a switching function of the first pair of semiconductor switches;

a first diode positioned in series between the first transformer and the third semiconductor switch;

a second diode positioned in series between the second transformer and the fourth semiconductor switch; and a zero-crossing detection (ZCD) circuit in communication with the second pair of semiconductor switches, the ZCD circuit being operable for detecting the zero-voltage crossing of the time-varying analog input signal and for transmitting the output signal indicative of the detected zero-voltage crossing to the third or fourth semiconductor switches.

2. The switching mode power amplifier device of claim 1, wherein the load has a power factor not less than 0.65.

3. The switching mode power amplifier device of claim 1, wherein the first and second semiconductor switches are metal-oxide semiconductor field effect transistors and the third and fourth semiconductor switches are insulated gate bipolar transistors.

4. The switching mode power amplifier device of claim 1, further comprising the modulation circuit.

5. The switching mode power amplifier device of claim 4, wherein the modulation circuit is configured to generate the modulated input signal via ternary modulation of the carrier signal.

6. The switching mode power amplifier device of claim 5, wherein the ternary modulation includes pulse density modulation or pulse density modulation.

7. The switching mode power supply of claim 1, wherein each of the first and second transformers has concentrically-wound primary and secondary windings.

8. A method for delivering power to a load using a switching mode power amplifier device having first, second, third, and fourth semiconductor switches and first and second transformers, the method comprising:
  receiving a modulated input signal from a modulating circuit, the modulated input signal having separate modulated positive and negative voltage signals corresponding to positive and negative components of a time-varying analog input signal, wherein the modulated input signal is comprised of the time-varying analog input signal and a carrier signal having a carrier frequency;
  directing the modulated positive and negative voltage signals to the first and second semiconductor switches, respectively;
  switching the first and second semiconductor switches at a switching rate that equals or exceeds the carrier frequency to thereby store energy from the respective modulated positive and negative voltage signals in the first and second transformers;
  detecting a zero-voltage crossing of the time-varying analog input signal using a zero-crossing detector (ZCD) circuit, wherein the time-varying analog input signal changes between the positive and negative components at the zero-voltage crossing;
  generating an output signal of the ZCD circuit indicative of the zero-voltage crossing; and
  selectively opening one of the third and fourth semiconductor switches and closing the other of the third and fourth semiconductor switches responsive to the output signal from the ZCD circuit to thereby deliver the energy stored in the first or second transformer, through a respective first or second diode, through the respective third or fourth semiconductor switch, and to the load in response to the zero voltage crossing, such that the load is isolated from a switching function of the first and second semiconductor switches.

9. The method of claim 8, wherein the load is a transducer, an audio speaker, or a motor.

10. The method of claim 9, wherein the load is the transducer, and the transducer is a sonobuoy transducer.

11. The method of claim 8, further comprising generating the modulated input signal via ternary modulation of the carrier signal using the modulation circuit, wherein the ternary modulation of the carrier signal includes pulse width modulation or pulse density modulation of the carrier signal.

12. The system of claim 8, wherein the modulation circuit is configured to generate the modulated input signal via ternary modulation of the carrier signal, including pulse width modulation or pulse density modulation of the carrier signal.

13. A switching mode power amplifier device for delivering power to a load, the switching mode power amplifier device comprising:
  first and second semiconductor switches configured to respectively receive a modulated positive voltage signal and a modulated negative voltage signal from a modulating circuit, the modulated positive and negative voltage signals being comprised of a carrier signal and respective positive and negative voltage portions of a time-varying analog input signal, the carrier signal having a carrier frequency that is less than a switching rate of the first and second semiconductor switches;
  a zero-crossing detection (ZCD) circuit in communication with the third and fourth semiconductor switches, the ZCD circuit being configured to detect a zero-voltage crossing of the time-varying analog input signal, and to transmit an output signal indicative of detection of the zero-voltage crossing to one of the third or fourth semiconductor switches;
  first and second inductors respectively connected to the first and second semiconductor switches, and respectively receiving the modulated positive and negative voltage signals from the first pair of semiconductor switches, wherein the first and second inductors store energy from the modulated positive and negative voltage signals, respectively, when the first or second semiconductor switches have an on/conducting state;
  third and fourth semiconductor switches electrically connected between a respective one of the first and second inductors and the load, wherein a switching state of the third and fourth semiconductor switches is configured to change to a closed/conducting state responsive to the output signal from the ZCD circuit, and wherein the closed/conducting switching state transfers the energy stored in the first and second inductors to the load, such that the load is isolated from a switching function of the first pair of semiconductor switches;
  a first steering diode positioned in series between the first inductor and the third semiconductor switch; and
  a second steering diode positioned in series between the second inductor and the fourth semiconductor switch.

14. The system of claim 13, wherein the first and second inductors are coupled inductors.

15. The system of claim 13, wherein the first and second inductors are uncoupled inductors.

16. The system of claim 13, wherein the first and second semiconductor switches are metal-oxide semiconductor field effect transistors and the third and fourth semiconductor switches are insulated gate bipolar transistors.

* * * * *

UNITED STATES PATENT AND TRADEMARK OFFICE
CERTIFICATE OF CORRECTION

PATENT NO. : 10,090,771 B2
APPLICATION NO. : 15/220705
DATED : October 2, 2018
INVENTOR(S) : Don Laturell et al.

It is certified that error appears in the above-identified patent and that said Letters Patent is hereby corrected as shown below:

Column 11, Line 19, cancel the text, "-- pulse density --", and insert the text: -- pulse width --.

Signed and Sealed this
Thirteenth Day of November, 2018

Andrei Iancu
*Director of the United States Patent and Trademark Office*